(12) United States Patent
Wehkamp et al.

(10) Patent No.: US 12,117,509 B2
(45) Date of Patent: Oct. 15, 2024

(54) MAGNETIC FIELD PROBE WITH ENCAPSULATED MR-ACTIVE SUBSTANCE

(71) Applicant: Albert-Ludwigs-Universität Freiburg, Freiburg (DE)

(72) Inventors: Niklas Wehkamp, Freiburg (DE); Maxim Zaitsev, Freiburg (DE); Philipp Rovedo, Freiburg (DE)

(73) Assignee: Albert-Ludwigs Universität Freiburg, Freiburg (DE)

( * ) Notice: Subject to any disclaimer, the term of this patent is extended or adjusted under 35 U.S.C. 154(b) by 222 days.

(21) Appl. No.: 17/601,468

(22) PCT Filed: Apr. 2, 2020

(86) PCT No.: PCT/EP2020/059387
§ 371 (c)(1),
(2) Date: Oct. 5, 2021

(87) PCT Pub. No.: WO2020/201417
PCT Pub. Date: Oct. 8, 2020

(65) Prior Publication Data
US 2022/0196765 A1   Jun. 23, 2022

(30) Foreign Application Priority Data
Apr. 5, 2019 (DE) ............ 10 2019 109 062.8

(51) Int. Cl.
*G01R 33/24* (2006.01)
*G01R 33/00* (2006.01)

(52) U.S. Cl.
CPC ......... *G01R 33/24* (2013.01); *G01R 33/0047* (2013.01)

(58) Field of Classification Search
CPC ..................... G01R 33/0047; G01R 33/24
See application file for complete search history.

(56) References Cited

U.S. PATENT DOCUMENTS

| 3,559,045 | A | 1/1971 | Robach et al. | |
|---|---|---|---|---|
| 2009/0295389 | A1* | 12/2009 | Pruessmann | G01R 33/24 324/318 |
| 2015/0045655 | A1* | 2/2015 | Biber | G01R 33/34084 600/414 |

FOREIGN PATENT DOCUMENTS

| EP | 2016184760 | 11/2016 |
|---|---|---|
| JP | 2000237161 | 9/2000 |
| WO | 2014027271 | 2/2014 |
| WO | 2015169655 | 11/2015 |

OTHER PUBLICATIONS

Translation of Chinese Office Action 202080034533.5; pp. 1-4; Mar. 27, 2024.*
Christoph Barmet et al. A transmiereceive system for magnetic held monitonug of in 5ivo MRE MAGAILIIe RESONANCE /NMELEC7Alt, vol. 62. No. 1., pp. 269-276, May 15, 2009 (May 15, 2009).

* cited by examiner

*Primary Examiner* — Jay Patidar
(74) *Attorney, Agent, or Firm* — Volpe Koenig (57) ABSTRACT

A magnetic field probe (1) having a capsule (3), in which an MR-active substance (5) is encapsulated. Two coils (7, 9) are preferably arranged in the capsule (3). Advantageous production methods for magnetic field probes (1) are also described, as well as advantageous uses of the magnetic field probe (1) and methods in which magnetic field probes (1) of this kind and arrangements of magnetic field probes (1) are used.

3 Claims, 3 Drawing Sheets

Fig. 1

MAGNETIC FIELD PROBE WITH ENCAPSULATED MR-ACTIVE SUBSTANCE

TECHNICAL FIELD

The invention relates to a magnetic field probe having a capsule encapsulating an MR-active substance and having a first coil disposed therein.

The invention further relates to an arrangement of magnetic field probes.

The invention further relates to processes for producing a magnetic field probe, for measurement of a property of a magnetic field by means of a magnetic field probe, and for operation of a magnetic field probe.

BACKGROUND

Magnetic field probes having the features described at the outset, an arrangement of such magnetic field probes, production of magnetic field probes and methods using a magnetic field probe are already known from the art.

For example, a magnetic field probe having the features described is used in order to measure a magnetic field generated in an MR instrument. It is possible thereby to ascertain precise data as to the magnetic fields actually applied in the course of an MR measurement, which can then be used to correct errors in order thereby to increase the image quality of a section image taken by way of an MR method.

In the context of this application, the abbreviation "MR" is used as an abbreviation for "magnetic resonance", the abbreviation "MRT" for "magnetic resonance tomography", the abbreviation "NMR" for "nuclear magnetic resonance", the abbreviation "HF" for "high-frequency", and the abbreviation "UV" for "ultraviolet".

The magnetic field probe can therefore also be referred to as MR probe when it is intended for use in an MR instrument. It can also be referred to as NMR probe. It can also be referred to as MRT probe when it is intended for use in an MRT instrument. The MR device may be an MRT device or an MR device intended for spectroscopy or an NMR device.

A problem with magnetic field probes known to date is that they have to be newly set up every time for the measurement of the magnetic field in the corresponding MR instrument and then taken out again for performance of the actual MR measurement of a measurement object. This is because the MR-active substance of a magnetic field probe is a foreign body visible in the MR measurement that can cause unwanted artifacts in the image measured. This problem has to date been solved in practice by using a particular MR-active substance, the resonance frequency of which varies considerably from the actual resonance frequency of the measurement object, for example in that the MR-active substance does not contain any $^1$H hydrogen nuclei, but rather other nuclei, for example $^{19}$F nuclei or $^2$H nuclei. This requires additional broadband electronics and incurs high costs.

SUMMARY

It is an object of the invention to improve the use properties of a magnetic field probe associated with the measuring of a magnetic field generated in an MR instrument in particular.

The invention achieves this object by using one or more of the features disclosed herein. More particularly, what the invention proposes in a magnetic field probe of the type described at the outset for achievement of the stated object is that a second coil be disposed within the capsule.

The use of two coils in a magnetic field probe has a multitude of applications, of which a multitude of uses of such a magnetic field probe of the invention have their own inventive quality.

For example, the second coil may be used to vary a magnetic field in a volume formed by the MR-active substance. This can be effected during an MR measurement on a measurement object and/or during an excitation of a measurement object and/or during an excitation of the MR-active substance by incidence of an HF field and/or during a signal acquisition of a signal received by the first coil and/or during a period of relaxation of longitudinal magnetization in the MR-active substance.

For example, the second coil may also be used to shift the resonance frequency of the MR-active substance during an MR measurement. A shift can be effected by applying a low-frequency magnetic field by means of the second coil during excitation of the measurement object and/or of the MR-active substance and/or during the emission of an MR excitation pulse. The excitation itself can especially be effected by incidence of an HF field. A shift can be effected during signal acquisition of a signal received by the first coil. The resonance frequency is preferably shifted to such an extent that the signal of the MR-active substance falls out of the receiving range and/or the transmission range of an MR instrument used for the MR measurement. In addition, the resonance frequency is preferably shifted to such an extent that the signal of the MR-active substance falls out of the measurement range of a measurement signal which is generated by the measurement object in the MR measurement, and/or out of the transmission range of an excitation pulse used for the MR measurement. The shift in the resonance frequency can be achieved, for example, by using the second coil to generate a homogeneous magnetic field in a volume formed by the MR-active substance. It is sufficient here for the magnetic field to be essentially homogeneous in the volume formed by the MR-active substance. The stronger the current flowing through the second coil, the greater the shift. The second coil is preferably operated at a constant current. Such a shift in resonance can have the advantage that signal components generated by the magnetic field probe that interfere in an MR measurement on a measurement object are reduced or avoided. This is because, if the MR-active substance is excited in a sufficiently off-resonant manner owing to its shift in resonance, an MR measurement on a measurement object is not disrupted. If the resonance frequency of the MR-active substance falls out of the range of the receiver unit, the MR signal emitted by the MR-active substance is not effectively received. If, by contrast, the magnetic field probe should give a signal, this is preferably achieved in that no current is sent through the second coil. This has the particular advantage, for example, that the magnetic field probe can remain in the MR instrument even during the MR measurement by which a measurement object is measured.

The shift in resonance may also be advantageous when it remains within the range of the receiver unit, for example when, in the case of simultaneous measurement of the magnetic field and of an object present in the MR instrument, adjustment of the resonance frequency of the MR-active substance is advantageous in order to avoid signal interferences with the signal absorbed by the object. The range of the receiver unit chosen here may be broader than that resulting from the range of the measurement object. The shift in resonance here may be chosen such that it is outside the measurement range of the measurement object, but within the range of the receiver unit.

In a further use, the second coil may be used for dephasing of the signal generated by the MR-active substance. This can be achieved, for example, in that the second coil generates a spatially varying magnetic field in a volume formed by the MR-active substance. The magnetic field preferably varies here in a linear manner within the volume. It is sufficient here when the magnetic field varies in an essentially linear manner within the volume. The second coil is preferably operated at constant or low-frequency current. Dephasing brought about in this way has the advantage, for example, that the magnetic field probe can be reused for measurement of a magnetic field even after a short duration. Dead times can be reduced thereby, or matched to the measurement on the measurement object.

The magnetic field to be measured by the magnetic field probe is preferably generated by an MR instrument.

In the context of the invention described here, a signal can be described as being of low frequency when its highest frequency component is lower at least by a factor of 10, preferably at least by a factor of 100, than the resonance frequency of the MR-active substance in the magnetic field to be measured. More particularly, a signal is of low frequency in the case of magnetic field strengths between 1T and 3T when the frequency spectrum is below 1 MHz. A signal in the context of this invention can be described as being of high frequency when it is at or close to the resonance frequency of the MR-active substance and/or of the measurement object. An excitation pulse with which on- or off-resonant excitation of the MR-active substance and/or excitation of the measurement object is effected, for example, is of high frequency. The signal emitted by the MR-active substance or the measurement object is also of high frequency.

The MR-active substance is a substance containing atomic nuclei, the nuclear spins of which can be excited to magnetic resonance. More particularly, this is a substance that can be excited in an MR instrument. More preferably, such an MR instrument is an MR instrument intended for spectroscopy and/or imaging of human tissue. The MR-active substance can especially be excited at field strengths of a homogeneous main magnetic field between 0.1 tesla and 10 tesla, preferably between 1 tesla and 7 tesla. The MR-active substance may, for example, contain hydrogen in the form of its $^1$H isotope or a $^2$H isotope, carbon in the form of its $^{13}$C isotope, fluorine in the form of its $^{19}$F isotope, phosphorus in the form of its $^{31}$P isotope or other MR-active isotopes. The MR-active substance may, for example, be water. It is possible to add at least one additive to the water in order, for example, to adjust its magnetic susceptibility and/or relaxation constants. An example of an additive that may be used is copper sulfate.

The use of water as MR-active substance or the use of an MR-active substance including hydrogen has the particular advantage that the magnetic field probe can be very accurately addressed and read out in a simple manner. The magnetic field probe can be addressed, for example, by exciting the MR-active substance with the first coil and generating a magnetic field with the second coil. Since the addressing and readout electronics of an MR instrument are typically designed for hydrogen, these electronics can likewise be used to address and/or read out the magnetic field probe. The electronics of the MR instrument are typically of high precision. Moreover, the use of the same electronics enables synchronous control and readout of magnetic field probe and MR instrument.

The MR-active substance preferably forms a volume having a diameter of less than 2 mm, more preferably of less than 1 mm. The MR-active substance preferably forms a volume of less than 10 microliters, more preferably of less than 1 microliter.

The capsule may form a body. The capsule preferably forms a homogeneous body.

The capsule is further preferably formed from a material of homogeneous composition. More particularly, the material may be a particular substance or a homogeneous mixture of two or more substances.

The fact that an MR-active substance is encapsulated in the capsule may be understood in that the MR-active substance is completely surrounded by a material forming the capsule. The MR-active substance therefore has no direct contact with a region outside the capsule.

A coil may be characterized in that it forms a section of an electric conductor. The conductor is preferably an insulated conductor. If an electric current flows through the coil, a magnetic field is generated.

The first coil and/or the second coil may be encapsulated here in the capsule. A current in this case could be generated in the first coil and/or the second coil, for example, by wireless energy transmission.

However, it is preferably the case that electrical terminals of the first coil and/or the second coil are led out of the capsule. The terminals permit precise and energy-efficient signal and energy transfer.

The MR-active substance has preferably been introduced into the capsule.

The MR-active substance has further preferably been disposed in the middle of the capsule.

The first coil and the second coil have further preferably been manufactured from an identical material. For example, the two coils have been manufactured from copper.

In an advantageous configuration of the magnetic field probe, it may be the case that a third coil or further coils is or are disposed in the magnetic field probe. The third coil or the further coils here may have features as described in relation to the first or the second coil. By virtue of such configurations, the magnetic field probe can be used in an even more versatile manner.

In an advantageous configuration of the magnetic field probe, it may be the case that the capsule is spherical. The capsule may also have a different shape, for example ellipsoidal or cylindrical. A spherical design of the capsule, however, has the particular advantage that the field lines in the object run homogeneously, such that the measurement properties of the magnetic field probe are improved and it gives more precise data.

For improvement of the measurement quality achievable with the magnetic field probe, it may further be the case that the materials of the capsule, of the first coil, of the second coil and/or of the MR-active substance are matched to one another. For example, it may be the case that the capsule is formed from a material having magnetic susceptibility matched to the susceptibility of a material of the first coil and/or of a material of the second coil. Alternatively or additionally, it may be the case that the susceptibility of the MR-active substance is matched to the susceptibility of a material of the first coil and/or of a material of the capsule. The susceptibilities are matched to one another especially when they are the same or at least essentially equal. Slight variances lead only to small signal perturbations, such that small variances that do not significantly worsen the signal quality of the magnetic field probe may be tolerable. This is because differences in susceptibility have the effect that the resultant field inhomogeneities perturb the MR signal generated by the MR-active substance and therefore worsen the measurement quality.

Matching of the susceptibilities can be effected, for example, by choosing the coil material in a suitable manner. For example, it is possible to use copper or an alloy having a desired susceptibility. The susceptibility of the capsule material can be matched by appropriate selection of the material or by addition to the material of particular substances that alter susceptibility. The susceptibility of the MR-active substance can also be influenced by the choice of substance, but also by adding particular additives to the substance, in that it is doped, for example, with a dopant that influences susceptibility.

In a further advantageous configuration of the magnetic field probe, it may be the case that the MR-active substance fills a cavity formed in and/or by the capsule. A cavity may be characterized in that it is closed off from the outside.

In a further advantageous configuration of the magnetic field probe, it may be the case that the MR-active substance forms direct contact with the capsule, which preferably consists of a material of homogeneous composition. In that case, the MR-active substance also forms direct contact with the capsule material. The MR-active substance preferably contacts the capsule, and hence the capsule material, with the entire surface area of the MR-active substance.

For avoidance of jumps in susceptibility, it is advantageous when no trapped air is present in the capsule and/or in the MR-active substance.

In a further advantageous configuration of the magnetic field probe, it may be the case that the MR-active substance is disposed in a volume surrounded by a winding of the first coil. Alternatively or additionally, it may be the case that the MR-active substance is disposed in a volume surrounded by a winding of the second coil. In that case, a signal generated by the MR-active substance interacts particularly efficiently with the coils.

In a further advantageous configuration of the invention, it may be the case that a winding of the first coil is disposed within a winding of the second coil. The windings of the first coil and the second coil and/or the magnetic fields generated by the two coils are preferably oriented orthogonally to one another. Such arrangements enable particularly compact coil windings and particularly compact magnetic field probes.

The MR-active substance preferably fills one or both of the aforementioned volumes. This can increase the strength of the MR signal generated, which can improve measurement quality.

It may further be the case that the first coil and/or the second coil has a cylindrical winding. These coils may especially be used with high efficiency for generation of a homogeneous magnetic field or one that varies in a linear manner or varies spatially in some other way. In addition, it can be produced in a particularly simple manner. However, other coil geometries are also possible, for example flat coils.

In a further advantageous configuration of the magnetic field probe of the invention, it may be the case that the second coil is designed such that it can be used to generate a homogeneous magnetic field in a volume formed by the MR-active substance. It is sufficient here when the magnetic field is essentially homogeneous. This permits interesting applications. Some of these applications are described further up. A homogeneous magnetic field can be generated, for example, by a solenoid coil or by a Helmholtz coil or else by a coil of another geometry, and a suitable winding can also be discovered, for example, by using computer simulations or optimization methods.

In a further advantageous configuration of the magnetic field probe, it may be the case that the second coil is designed such that it can be used to generate a spatially varying magnetic field in a volume formed by the MR-active substance. The second coil here is preferably designed such that it can be used to generate a linearly varying magnetic field in a volume formed by the MR-active substance. It is sufficient here that magnetic field varies essentially linearly in the volume. Other possible and advantageous configurations may be those in which the magnetic field varies spatially in a non-linear manner. Such variations may have interesting applications, some of which have already been described before. A coil that generates a spatially varying field may, for example, be a Maxwell coil or any other coil that generates such a varying magnetic field.

The use of a Helmholtz coil pair may be particularly advantageous since it can firstly generate a homogeneous magnetic field by supplying both coils in the same sense, but also a varying, preferably linearly varying, field by supplying the coils in opposite senses. Such magnetic field probes are therefore usable in various ways. In order to achieve operability of the Helmholtz coil pair in the same sense and in opposite senses, it may be advantageous when the coil pair is formed not from a single coil but from two coils each having separate terminals. In this case, the magnetic field probe has at least three coils.

It may further be the case that the capsule is formed from a cured material. The material may have been cured, for example, by electromagnetic radiation, for instance light or UV light. The capsule may consist, for example, of a cured adhesive and/or of a polymer. The material may also be a thermoplastic that has been cured by cooling. Another appropriate type of material may be one that has been cured by heating.

For achievement of the stated object, it may be the case in accordance with the invention that a magnetic field probe has a capsule encapsulating an MR-active substance and a first coil is disposed therein. It is also the case here in accordance with the invention that the MR-active substance fills a cavity formed by the capsule. The capsule preferably consists of a material of homogeneous composition. It is preferably the case that the MR-active substance forms direct contact with the capsule. More preferably, the MR-active substance contacts the capsule with the entire surface area of the MR-active substance. The MR-active substance may, for example, however, also contact the capsule with a first portion of its surface and the first and/or the second coil with another portion, especially the remaining portion, of its surface. Further variants result from combination with features of variants and configurations of the magnetic field probe already described above. More particularly, the magnetic field probe may have a second coil.

For achievement of the stated object, the invention envisages the use of one or more features disclosed herein directed to an arrangement of magnetic field probes. More particularly, for achievement of the stated object, it is envisaged that the magnetic field probes are each designed in accordance with the invention, especially as described above and/or according to any of the claims directed to a magnetic field probe. The use of a multitude of magnetic field probes allows a magnetic field to be measured more accurately. For example, it is possible to use 16 magnetic field probes, which means that the magnetic field can be approximated up to term 3 in its multipole expansion.

According to the application, the arrangement may also have fewer or more magnetic field probes.

In an advantageous configuration of the arrangement of magnetic field probes, it may be the case that the first coil can be connected or is connected to receiving electronics and/or transmission electronics, wherein the receiving electronics is/are set up to receive a signal transmitted by the MR-active substance and the transmission electronics to transmit an HF signal. Alternatively or additionally, it may be the case that the second coil can be connected or is connected to actuation electronics, especially transmission electronics, wherein the actuation electronics are set up to generate a magnetic field that is constant over time and/or of low frequency and/or high frequency. Such an arrangement of magnetic field probes is usable in a flexible manner. The receiving electronics and/or the actuating electronics are preferably the receiving electronics and/or the actuating electronics of an MR instrument that generates the magnetic field to be measured by the magnetic field probe.

The stated object is achieved in accordance with the invention by provision of one or more of the features disclosed herein directed to a production process for production of a magnetic field probe. More particularly, for achievement of the stated object, what is thus proposed in accordance with the invention in such a production process is that a first coil is disposed in a curable material and that the curable material is then cured. It is also envisaged in accordance with the invention that, prior to the curing of the material, an MR-active substance is introduced into the material. As a result, the MR-active substance is especially encapsulated within and by the curable material. The MR-active substance is preferably introduced directly or immediately into the material. Further preferably, the MR-active substance is injected into the material. The injection can be effected, for example, by means of a pipette or by means of a microfluidic printer. It is preferably the case that the MR-active substance is introduced, especially injected, by displacement of the material. The introduction of the MR-active substance directly into the curable material that forms the capsule already mentioned above after curing has the advantage that the production of the magnetic field probe becomes particularly simple, since it is possible to dispense, for example, with the use of glass tubes in which the MR-active substance would be introduced. Moreover, such a production process permits great freedoms in respect of the coil construction and the design of the capsule.

In one configuration of this production process, it may be the case that the curing of the material is preceded by arrangement of a second coil within the material. In this way, it is possible to produce a magnetic field probe of the invention with features as described above in a particularly simple manner.

For achievement of the stated object, in a production process for production of a magnetic field probe, it is alternatively or else additionally envisaged in accordance with the invention that an MR-active substance is introduced, especially injected, into an internal volume surrounded by an outer surface of a curable material, and the material is then cured, wherein the curing of the material is preceded by arrangement of a first coil within the internal volume. It is further envisaged here in accordance with the invention that the curing of the material is preceded by arrangement of a second coil within the material. The production process thus enables the production of a magnetic field probe that may especially be designed as described above. Preference is given here to introducing the MR-active substance by introduction, especially injection, into the material.

The above-described production processes can also be combined with one another. Variants of the production processes arise through variation of the sequence of the individual production steps required for production of the magnetic field probe. It is preferably the case that the first and/or the second coil is/are first positioned and, in a next step, the curable material is brought to the coils already positioned, before the MR-active substance is then introduced into the internal volume and/or injected into the material. Alternatively, it is also possible, for example, first to set up the curable material, then to position the first and/or second coil within the material and, in a third step, to add the MR-active substance.

The MR-active substance, as already described above, is preferably arranged in a volume surrounded by a winding of the first coil and/or in a volume surrounded by a winding of the second coil.

Further preferably, as already described above, a winding of the first coil is arranged within a winding of the second coil, in which case the windings of the first coil and of the second coil and/or the magnetic fields generated by the two coils are preferably oriented orthogonally to one another.

The curable material and/or the above-described internal volume and/or the MR-active substance preferably forms a droplet.

In an advantageous configuration of the production processes, it may be the case that the material is cured by means of electromagnetic radiation, for instance light, ultraviolet light, x-radiation or infrared radiation and/or by temperature variation, such as by heating and/or cooling in particular, and/or catalytically, for example by use of a two-component epoxy resin. The material may therefore especially be an adhesive curable preferably by means of UV light and/or a light-curing polymer and/or a thermoplastic. The capsule already described above may therefore be formed from a cured material, in which case this material is a thermoplastic and/or a material cured by means of electromagnetic radiation. The use of such materials and curing methods can simplify and improve the production of the magnetic field probes and the properties of the magnetic field probes produced.

Preferably, the first and/or the second coil is arranged such that its electrical terminals each project outward out of the internal volume and/or out of the curable material.

In the further advantageous configuration of the production processes, it may be the case that a quantum of the curable material is first laid out on a working surface and then cured. The working surface is preferably a flat working surface. The setup can be effected, for example, by applying a droplet of the curable material to the working surface. After the material has been cured, the cured quantum is then turned over, especially by 180° at right angles to its axis of symmetry, and then serves as basis for the further production of the magnetic field probe using the production steps as described above. Such configurations of the production processes have the advantage that they simplify the positioning of the first and/or of the second coil and of the MR-active substance at a desired position in the capsule.

In a further advantageous configuration of the production processes, it may be the case that the capsule of the magnetic field probe is produced by repeated application of a respective new layer of as yet uncured material and curing of the last layer applied. This produces the shape of the capsule in a controlled manner, such that it takes on a desired shape, for example a spherical shape.

In a further advantageous configuration of the production processes, it may be the case that the curable material is more viscous than the MR-active substance. This has the advantage that the MR-active substance can be introduced more easily into the material.

It may alternatively be the case that the curable material is less viscous than the MR-active substance. This has the advantage that trapping of air is prevented.

For adjustment of the viscosity of the MR-active substance, it may especially contain at least one additive that influences the viscosity. For example, the MR-active substance may contain a gelating addition, for instance agarose. The MR-active substance may especially comprise or consist of water and such an additive, and optionally further additives.

In a further advantageous configuration of the invention, it may be the case that the material properties of the MR-active substance and of the curable material are chosen such that the MR-active substance, after introduction into the material, takes on an elliptical, preferably spherical, geometry. An elliptical geometry, and certainly a spherical geometry, is firstly particularly compact and, secondly, the signal emanating from such a geometry gives particularly exact information as to a property of the magnetic field to be measured.

Preference is given to choosing surface tension, viscosity and density of the MR-active substance and of the curable material such that the MR-active substance, after being introduced into the material, takes on an elliptical, preferably spherical, geometry.

More preferably, the choice of surface tensions leads to phase separation that withstands even mechanical influences. It is then, for example, more easily possible to position the MR-active substance.

The correct viscosity is important, among other reasons, so that a droplet breaks off when the MR-active substance is introduced into the curable material and the MR-active substance remains in the material before the capsule is cured.

This may result in an upper limit in the viscosity. On the other hand, a high viscosity may be advantageous since the mobility of the MR-active substance can thus be limited even before the curing of the material and the MR-active substance can be more easily positioned. The density of the material must not vary too significantly from the density of the MR-active substance, since the MR-active substance can otherwise float or sink.

For achievement of the stated object, a measurement process for measuring a property of a magnetic field may further be provided by the invention. The property to be measured may especially be a magnetic field strength and/or its evolution against time at the position of the magnetic field probe. More particularly, for achievement of the stated object, the invention proposes, in such a measurement process, that a magnetic field probe designed in accordance with the invention, which is thus designed as described above and/or according to any of the claims directed to a magnetic field probe, is used. The magnetic field is preferably generated by an MR instrument. Further preferably, before, after or during the measurement of the property of the magnetic field with the MR instrument, an MR measurement on a measurement object is conducted, with the magnetic field probe here remaining within the MR instrument.

For achievement of the stated object, the invention proposes the use of one or more of the features disclosed herein directed to a method of operating a magnetic field probe. More particularly, for achievement of the stated object, it is thus envisaged in accordance with the invention that the magnetic field probe is designed in accordance with the invention, especially as described above and/or according to any of the claims directed to a magnetic field probe. Preferably, the first coil receives a signal from the MR-active substance, and the second coil generates a constant magnetic field over time. Alternatively or additionally, the second coil generates a low-frequency magnetic field. Moreover, alternatively or additionally, the second coil generates a high-frequency magnetic field. Developments and applications of interest for such methods have already been described above.

More preferably, the signal received by means of the first coil is processed further by means of receiving electronics of an MR instrument. Further preferably, the second coil is actuated by means of actuating electronics of an MR instrument. The magnetic field probe is preferably arranged here within the MR instrument.

Further configurations of a method of operating a magnetic field probe have already been described above in connection with particular uses of the magnetic field probe. The methods described therein, even irrespective of the uses specifically described, form the subject matter of inventive developments of the above-described method.

In a further advantageous configuration of the method, it may be the case that the MR-active substance has a shift in resonance with respect to the resonance frequency of a substance of a measurement object disposed within an MR instrument. The substance is especially water. The shift in resonance can be effected by suitably setting up the MR-active substance, for example by choice of a suitable molecule for the MR-active substance and/or by doping with an additive. Alternatively or additionally, the second coil may be designed to generate a homogeneous magnetic field and operate it with a constant current in order to achieve the shift in resonance, especially as already described above. The shifted resonance frequency here is preferably outside the range which is used for the measurement on the measurement object. Alternatively, the second coil can be operated with a low-frequency AC current. In this way, it is possible to split the resonance frequency of the MR-active substance into multiple frequencies, which permits undisrupted simultaneous excitation of the MR-active substance and readout of a signal generated by the MR-active substance. Excitation of the measurement object and/or of the MR-active substance can be accomplished using an HF transmission coil of the MR instrument. Excitation of the MR-active substance can alternatively be accomplished using the first coil. It is also possible to use a third coil arranged within the magnetic field probe for this purpose. This enables measurement of a property of a magnetic field by means of the magnetic field probe while a simultaneous MR measurement of a measurement object is conducted, without interference between the signal generated by the MR-active substance and the signal generated by the measurement object when the signal is received.

BRIEF DESCRIPTION OF THE DRAWINGS

The invention is now described in detail with reference to a few working examples, but is not limited to these few working examples. Further variants of the invention and working examples result from combination of the features of individual or multiple claims with one another and/or with individual or multiple features of the working examples and/or of the above-described variants of inventive devices and processes.

The figures show.

DETAILED DESCRIPTION

In the description of various working examples of the invention that follows, elements of corresponding function are given identical reference numerals even in the case of different configuration or shaping.

Figure 1:
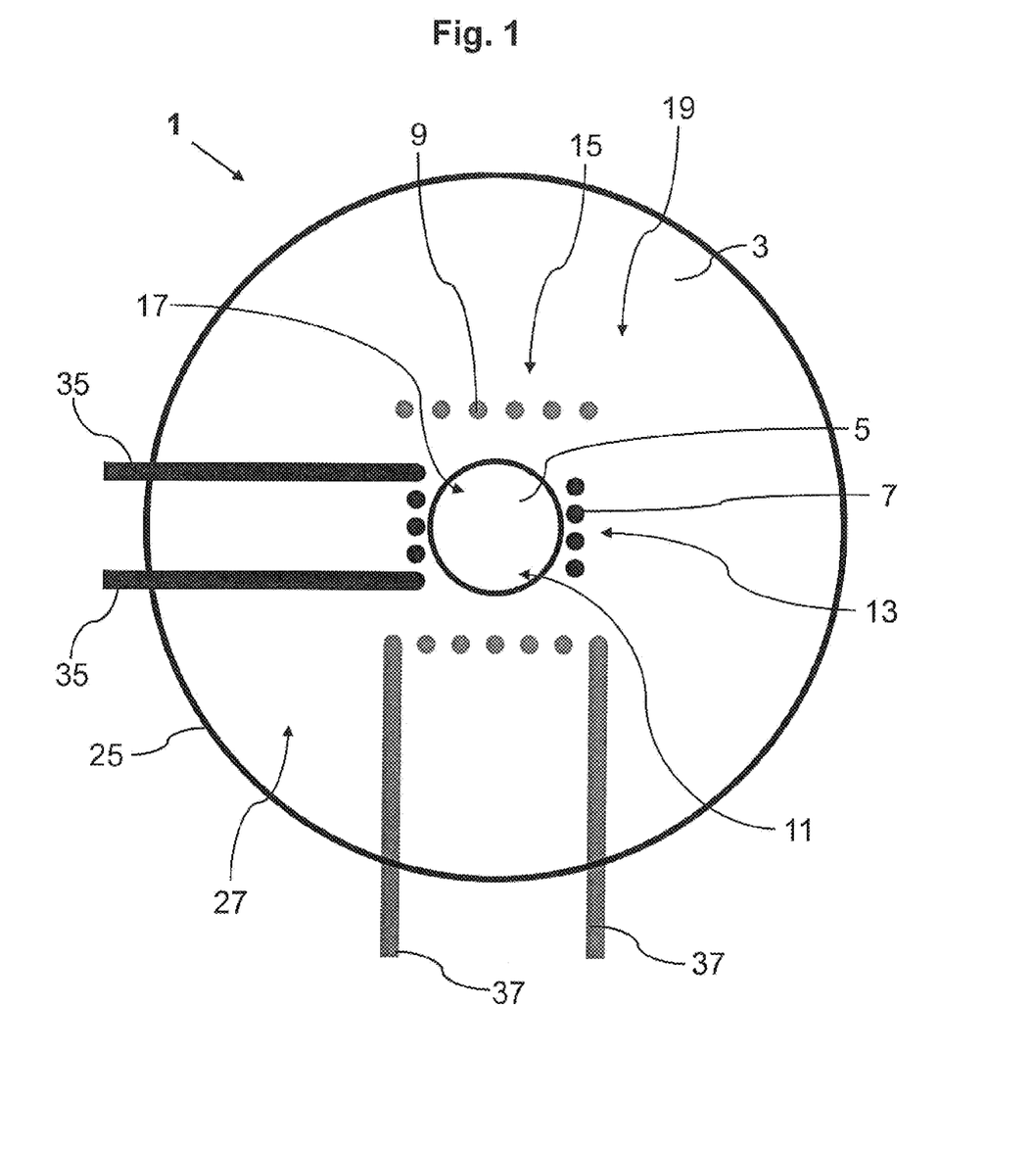
FIG. 1 a working example of a magnetic field probe of the invention.

The magnetic field probe 1 shown in FIG. 1 has a capsule 3 made of ultraviolet light-cured material 19. The capsule 3 is spherical. The capsule 3 is in solid form and closed off from the outside. The surface 25 forms a continuous face; only at four points do terminals 35 and 37 for a first coil 7 and second coil 9 embedded in the capsule 3 project out of the capsule 3. Formed in the middle of the capsule 3 is a cavity 11 completely filled with an MR-active substance 5, which in the working example described here consists essentially of water doped with a substance having the effect that the susceptibility of the MR-active substance 5 is equal to the susceptibility of the material 19 of the capsule 3 and to the susceptibility of the first coil 7 and second coil 9 consisting of copper wire.

The first coil 7 has a winding 13. The winding 13 is configured such that the coil 7 forms a solenoid coil. The second coil 9 also has a winding 15. The coil 9 in the working example described here is likewise a solenoid coil. The first coil 7 has an internal diameter corresponding to the external diameter of the volume 17 occupied by the MR-active substance. The first coil 7 is arranged within a volume surrounded by the second coil 9. The first coil 7 and the second coil 9 are oriented orthogonally to one another.

The MR-active substance 5 is encapsulated in the capsule 3. The MR-active substance 5 is enclosed in the capsule 3.

The MR-active substance 5 is disposed within an internal volume 27, with the internal volume 27 in the working example described here occupying that volume surrounded by the outer surface 25 of the cured material 19.

The second coil 9 in solenoid form, in the volume 17 formed by the MR-active substance 5, generates a homogeneous magnetic field when a potential difference is applied to the terminals 37 of the second coil 9 and therefore a current flows through the second coil 9.

If the second coil 9 is operated at constant current, there is thus a uniform change in the magnetic field strength in the volume 27 of the MR-active substance 5, such that the resonance frequency of the nuclear spins of the hydrogen nuclei present in the MR-active substance 5 is shifted by a current-dependent value. Some technical effects and practical applications in this regard have already been described above.

In alternative working examples that are not shown here, the first coil 7 and/or the second coil 9 are configured differently, such that, for example, the second coil 9 does not generate a homogeneous magnetic field, but rather a spatially varying magnetic field, for instance a linearly varying magnetic field. Some variants in this regard have already been described further up.

Figure 2:
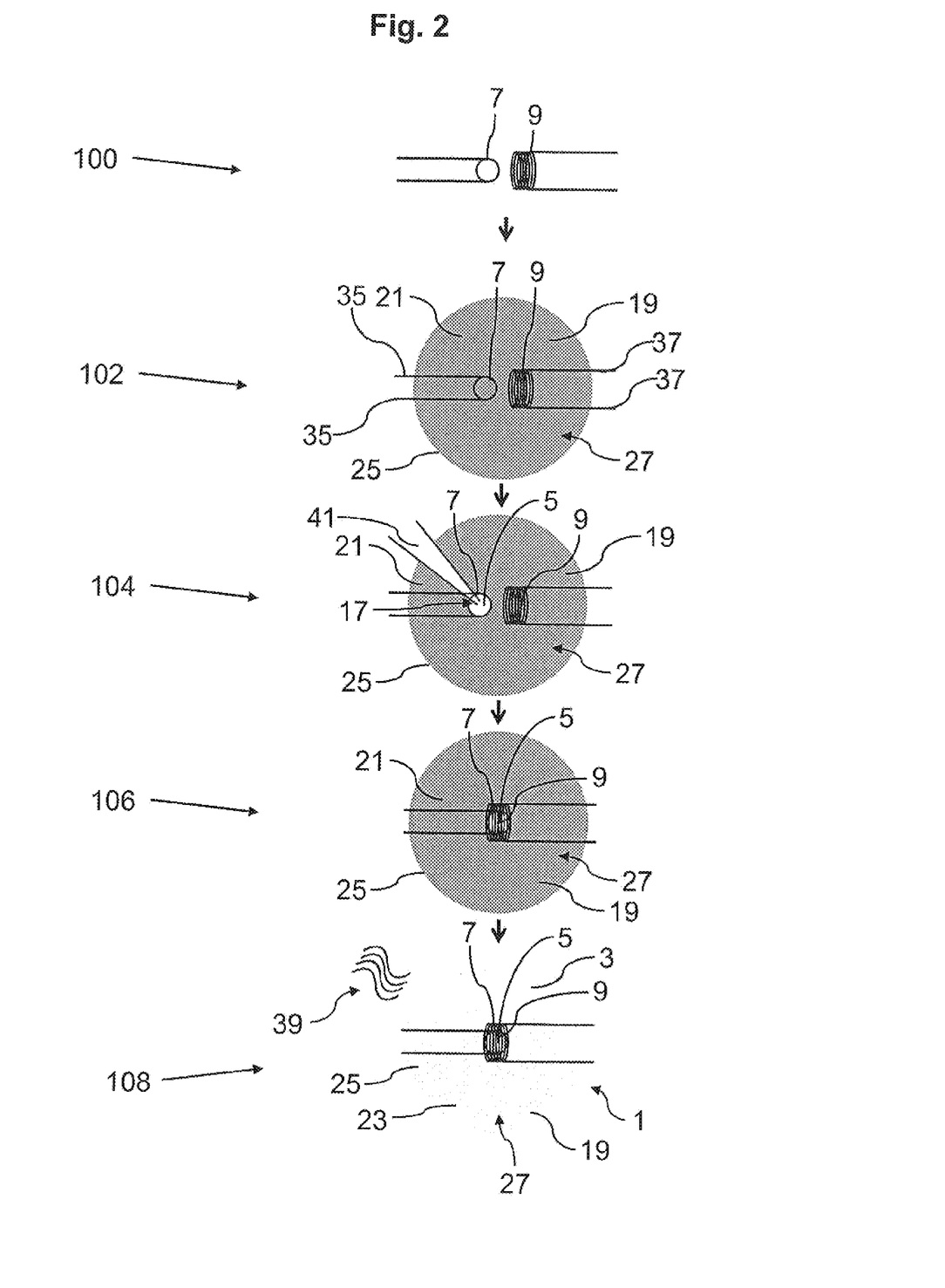
FIG. 2 a working example of a production process of the invention for production of a magnetic field probe according to FIG. 1, and FIG. 3 an alternative working example of a production process of the invention for production of a magnetic field probe according to FIG. 1.

FIG. 2 shows, from the top downward, multiple steps of a process by which a magnetic field probe 1 according to FIG. 1 can be produced. In a first process step 100, the first coil 7 and the second coil 9 are positioned alongside one another. In a second process step 102, a droplet of curable material 19 that forms the capsule 3 of the magnetic field probe 1 after curing is then applied, such that the first coil 7 and the second coil 9 are arranged in the middle of the material 19. The terminals 35 and 37 of the first coil 7 and of the second coil 9 project out of the material 19.

In a third process step 104, a pipette 41 is then used to inject a small droplet of the MR-active substance 5 into the curable material 19. This is injected into a volume surrounded by the first coil 7. The introduction of the MR-active substance 5 into the material 19 displaces the material 19 at this point. The MR-active substance 5 forms a spherical geometry, the spherical surface of which is fully encapsulated within and by the material 19. In the working example shown here, the diameter of the volume 17 occupied by the MR-active substance 5 corresponds to the internal diameter of the first coil 7. The internal diameter of the first coil 7 may, for example, be 1 mm, and the external diameter thereof may, for example, be 1.4 mm. In an alternative working example, the internal diameter of the first coil 7 is greater than the diameter of the volume occupied by the MR-active substance 5.

In a next process step 106, the first coil 7 together with the MR-active substance 5 is pushed into the second coil 9, such that the winding 13 of the coil 7 is surrounded by the winding 15 of the second coil 9. The second coil 7 may have, for example, an internal diameter of 1.8 mm and an external diameter of 2.2 mm. The two coils 7, 9 in the working example described here are wound from enameled copper wire. After this process step, the winding 13 of the first coil 7 and the winding 15 of the second coil 9 both surround the volume 17 filled by the MR-active substance 5. The first coil 7, the second coil 9 and the MR-active substance 5 are shifted here such that they are disposed exactly in the middle of the material 19. At this juncture, the material 19 has not yet cured. Prior to curing of the material 19, in FIG. 2 and also in FIG. 3, the material 19 is additionally given the reference numeral 21 and is shaded dark grey.

In a final production step 108, the uncured material 19, 21 is then irradiated with UV light, such that the material 19 cures. After curing, the material 19, in FIG. 2 and also in FIG. 3, is additionally given the reference numeral 23 and is shaded light grey.

Figure 3:
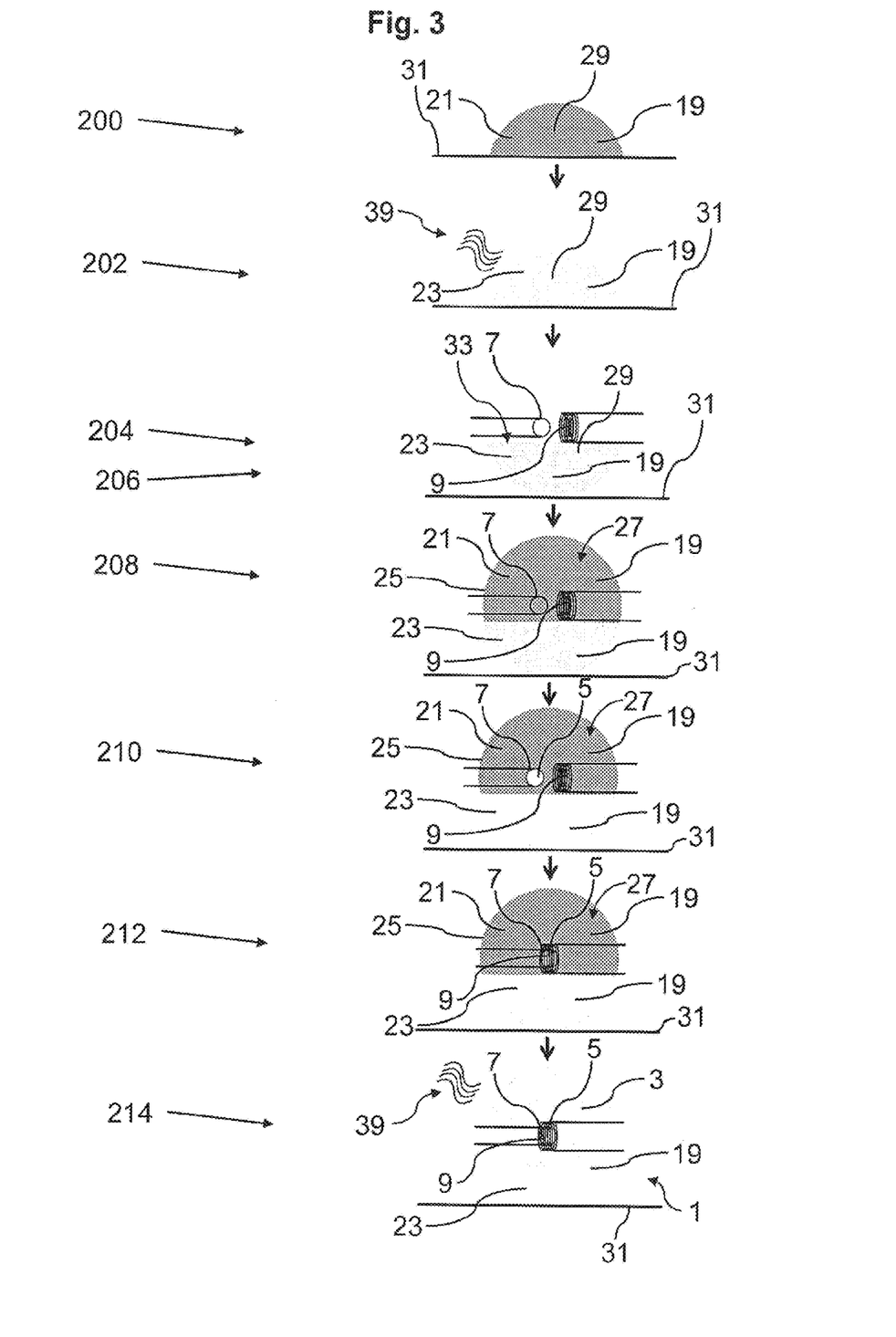

FIG. 3 illustrates an alternative production process of the invention for the magnetic field probe 1 from FIG. 1.

In a first process step 200, a droplet of an as yet uncured material 19, 21 is applied to a flat working surface 31. The material 19, 21 is then irradiated with UV light 39, such that the material 19 cures and forms a cured material 19, 23. This is effected in step 202. This gives rise to part of a capsule 3.

In the next process step 204, the cured material 19, 23 on the working surface 31 is turned over, such that the surface of the material 19, 23 that was in contact at first with the flat working surface 31 forms a flat base 33. The further process steps 206 to 214 by which the magnetic field probe 1 is produced are then executed on this base 33. Process steps 206 to 214 correspond to process steps 100 to 108 already described above in FIG. 2, with the positioning of the first coil 7 and of the second coil 9 in the middle of the material 19 having been facilitated since part of the capsule 3 has already cured and the first coil 7 the second coil 9 can therefore be positioned directly on the base 33. Further as yet uncured material 19, 21 is applied to the base 33 and then in multiple layers that are not shown explicitly in FIG. 3, which are cured layer by layer after each application, so as to give the overall result of a spherical capsule 3. The base 33 forms part of the capsule 3.

What is described in summary is a magnetic field probe 1 with a capsule 3 encapsulating an MR-active substance 5. What is more particularly proposed is that two coils 7, 9 are disposed in the capsule 3. Also described are advantageous production processes for magnetic field probes 1, and beneficial uses of the magnetic field probe 1 of the invention, as are methods in which such magnetic field probes 1 and arrangements of magnetic field probes 1 are used.

LIST OF REFERENCE NUMERALS

1 magnetic field probe
3 capsule
5 MR-active substance
7 first coil
9 second coil
11 cavity
13 winding of 7
15 winding of 9
17 volume
19 material
21 material 19 before curing
23 material 19 after curing
25 surface
27 internal volume
29 quantum of 19
31 working surface
33 base
35 terminal
37 terminal
39 UV light
41 pipette

The invention claimed is:

1. A magnetic field probe (1), comprising:
a capsule (3) encapsulating an MR-active substance (5);
a first coil (7) disposed within the capsule, the first coil at least one of receiving a signal from the MR-active substance or exciting the MR-active substance;
the MR-active substance (5) fills a cavity (11) formed by the capsule (3),
wherein the cavity is closed off from outside, and
wherein the MR-active substance forms direct contact with the capsule.

2. The magnetic field probe (1) as claimed in claim 1, wherein the capsule (3) is in spherical form.

3. The magnetic field probe (1) as claimed in claim 1, wherein the capsule (3) is formed from a material (19) of homogeneous composition.

* * * * *